United States Patent
James et al.

(10) Patent No.: US 6,763,426 B1
(45) Date of Patent: Jul. 13, 2004

(54) CASCADABLE CONTENT ADDRESSABLE MEMORY (CAM) DEVICE AND ARCHITECTURE

(75) Inventors: David V. James, Palo Alto, CA (US); Jagadeesan Rajamanickam, Cupertino, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 190 days.

(21) Appl. No.: 10/109,364

(22) Filed: Mar. 28, 2002

Related U.S. Application Data

(60) Provisional application No. 60/343,973, filed on Dec. 27, 2001.

(51) Int. Cl.[7] .............................................. G06F 12/00
(52) U.S. Cl. ........................................ 711/108; 365/49
(58) Field of Search ............................ 711/108; 365/49; 713/160

(56) References Cited

U.S. PATENT DOCUMENTS

| | | | | |
|---|---|---|---|---|
| 5,568,416 A | * | 10/1996 | Kawana et al. | 365/49 |
| 5,930,359 A | * | 7/1999 | Kempke et al. | 713/160 |
| 5,986,677 A | | 11/1999 | Jones et al. | |
| 6,167,480 A | | 12/2000 | Williams et al. | |
| 6,275,491 B1 | | 8/2001 | Prasad et al. | |
| 6,301,636 B1 | * | 10/2001 | Schultz et al. | 711/108 |
| 6,493,793 B1 | * | 12/2002 | Pereira et al. | 711/108 |
| 6,597,596 B2 | * | 7/2003 | Gordon et al. | 365/49 |

OTHER PUBLICATIONS

"IEEE Standard for Scalable Coherent Interface (SCI)", *IEEE Std 1596–1992*, Institute of Electrical and Electronic Engineers, Inc., New York, NY, pp. 4–25 and 47–72, May 23, 2001.

* cited by examiner

*Primary Examiner*—Nasser Moazzami
(74) *Attorney, Agent, or Firm*—Bradley T. Sako

(57) ABSTRACT

According to one embodiment, a CAM system (100) may include a plurality of CAM devices (102-0 to 102-n) arranged in cascade configuration. A CAM system (100) may include an input connection (104) that receives a request to perform a particular operation and an output connection (106) on which a CAM system (100) may provide a single response based on responses from each CAM device (102-0 to 102-n). In one particular approach, a request may flow through CAM devices (102-0 to 102-n) in a single direction from a first CAM device (102-0) to a last CAM device (102-n). Similarly, responses to requests may be generated in the same direction, from a first CAM device (102-0) to a last CAM device (102-n).

19 Claims, 9 Drawing Sheets

CASCADABLE CONTENT ADDRESSABLE MEMORY (CAM) DEVICE AND ARCHITECTURE

This application claims the benefit of provisional application Serial No. 60/343,973 filed Dec. 27, 2001.

TECHNICAL FIELD

The present invention relates to content addressable memory (CAM) devices, and particularly to CAM based systems that can include multiple CAM devices.

BACKGROUND OF THE INVENTION

Content addressable memory (CAM) systems typically include one or more CAM devices. A CAM device can include circuitry for performing one or more types of search operations. In a search operation, a comparand (or key) may be compared to multiple entries to see if all or a portion of the key matches an entry. After a search operation, a CAM device may give a search result as an output. Typically a search result may include an "index" value which may be used to access associated data or to provide data itself.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic random access memory (DRAM) type cells. Alternate approaches may include random access memories (RAM) arrays, or the like, with separate matching circuits and/or processes.

To better understand the various features and aspects of CAM systems, and CAM system performance, two conventional CAM systems will now be described.

A first conventional CAM system is shown in FIG. 16 and designated by the general reference character 1600. A conventional CAM system 1600 may include one or more CAM devices, each of which may perform a search operation. In the example of FIG. 16, a CAM system 1600 includes "n+1" CAM devices, shown as 1602-0 to 1602-n. A CAM system 1600 may perform search operations in response to commands from a requesting device. In FIG. 16, a requesting device is a network processing unit (NPU) 1604.

FIG. 16 shows an example of a bus based CAM system. In a bus based CAM system, CAM devices may be commonly connected to a requesting device and to one another by a common bus. Thus, in FIG. 16 CAM devices (1602-0 to 1602-n) can be commonly connected to each other and to an NPU 1604 by a bus 1606.

A drawback to bus based systems can be speed limitations. Larger interconnect lengths of bus lines as well as the input capacitances of each device can present considerable capacitive loads for an NPU 1604 and CAM devices (1602-0 to 1602-n). Thus, while a bus based CAM system 1600 may be scaled up by increasing the number of CAM devices (1602-0 to 1602-n), such an approach may increase bus loading, reducing performance.

A bus based CAM system 1600 may have other drawbacks. Some sort of bus arbitration may be necessary to select one of multiple possible results. That is, while a search request may be issued from an NPU 1604 to CAM devices (1602-0 to 1602-n) simultaneously, individual search results for the CAM devices (1602-0 to 1602-n) can be generated, and some sort of mechanism may have to be included to select which particular response would be received separately by an NPU 1604. Special bus arbitration hardware may allow a "winning" device to transmit a result to an NPU 1604. Such bus arbitration hardware may be undesirably complex in the event a system includes software assigned priority between CAM devices (1602-0 to 1602-n).

Further, some additional processing is needed to process multiple results from multiple CAM devices. As but one example, more than one CAM device (1602-0 to 1602-n) may generate a match result in response to a key. Some sort of evaluation would then be necessary to establish a precedence between CAM devices (1602-0 to 1602-n). It is noted that such a precedence may make a system inflexible. As more and more CAM devices (1602-0 to 1602-n) are added, evaluating a search result can require that precedence between all devices must be known to ensure a highest precedence device result is provided as an output.

A second conventional CAM system is set forth in FIG. 17 and designated by the general reference character 1700. A second conventional CAM system 1700 may include a number of CAM devices (1702-0 to 1702-3) having common connections to a command and data bus 1704, as well as separate common connections to an index or result bus 1706. Optionally, an index or result bus 1706 may be connected to one or more memory devices 1708, such as a static random access memory (SRAM).

In a system like that shown in FIG. 17, a search command may be issued from a host device 1710 on a command and data bus 1704. CAM devices (1702-0 to 1702-3) may process such commands and generate results, which may be output on an index or result bus 1706. Results may be returned to a command issuing host device 1710 by way of a result bus. Optionally, results may be applied to one or more memory devices 1708 to generate data that may then be accessed by a host device 1710.

A second conventional system 1700 may suffer from many of the drawbacks noted above. If a number of CAM devices is increased, bus loading can grow correspondingly. Further, some sort of logical protocol may be necessary to establish priority between results of multiple CAMs. As the number of CAM devices grows, such a protocol may get more complex or involve greater time periods for execution.

In light of the above, it would be desirable to arrive at a CAM system that does not rely on a common bus between a request issuing device and multiple CAM devices, but at the same time can provide improved performance over conventional cascaded approaches.

It would also be desirable to arrive at some way of addressing the drawback of having to process multiple CAM device results in a CAM system.

It would also be desirable to arrive at a CAM device that may be cascaded with other like CAM devices, and yet not suffer from the various drawbacks of conventional CAM systems.

SUMMARY OF THE INVENTION

According to the present invention, a content addressable memory (CAM) system may include a plurality of CAM devices arranged in series. A CAM system may include at least one input port that receives requests to perform particular operations. A CAM system may also include at least one output port that may provide a response based on responses generated by each CAM device.

According to one aspect of the embodiments, each CAM device may include a request path for transferring a request received at an input port to one or more output ports. Thus, requests may flow through sequential CAM devices, and not on a common bus.

According to another aspect of the embodiments, each CAM device can vote between multiple responses. In particular, each CAM device may include a first vote portion. A first vote portion may generate an output response based on a "local" response generated by the CAM device and a "remote" response generated by some other CAM device at a previous location in the series.

According to another aspect of the embodiments, further voting capabilities may be provided by a second vote portion in each CAM device. A second vote portion may generate a response based on two or more remote responses, each generated by different CAM devices at previous locations in the series.

According to another aspect of the embodiments, one response may be based on multiple responses according to precedence data associated with each response. Such precedence data may take a variety of forms. In one arrangement, precedence data may include a status value and a chip value. A status value may be assigned to a particular response type or according to a programmed priority value. A chip value may be a unique value assigned to a CAM device generating a response. Selection of response may be accomplished with a magnitude comparator circuit that compares status and chip values of responses.

According to another aspect of the embodiments, CAM devices in the system may be arranged into two or more branches. Thus, requests may be supplied to multiple branches by "branching" CAM devices. Similarly, responses from multiple branches may be merged by merging CAM devices. A branching CAM device can receive at least one request at an input port and provide such a request at two or more output ports. Each output port may be connected to a different branch of CAM devices. A merging CAM device can receive remote responses on different input ports, where each remote response may be generated from a different branch of CAM devices. A merging CAM device may generate a response based on such remote responses.

According to another aspect of the embodiments, each CAM device may generate a response from a request with a same latency.

According to the present invention, a CAM device may have a unique structure to enable cascading of multiple CAM devices. According to particular embodiments, a CAM device may include a search portion that generates a response from a received operation request. In addition, a CAM device can include a first vote portion. A first vote portion may generate a response based on a local response generated by a search portion and one or more remote response received at input ports.

According to one aspect of the embodiments, a CAM device vote portion may include a vote circuit. A vote circuit may perform an operation that generates an output response based on different responses, such as local and remote responses. In one embodiment, a vote circuit may include a magnitude comparator that compares portions of responses.

According to another aspect of the embodiments, a CAM device may include both a first and second vote portion. A second vote portion may generate a response based on two remote responses received at different input ports.

According to another aspect of the embodiments, a CAM device can include an interface portion that can provide additional connections to a CAM device. An interface portion may include a multiplexer that selects between an input port and a secondary port. An interface portion may also include an interface circuit that transfers data between one clock domain and another. As but one example, an interface circuit may transfer data between separate input and output paths and a bidirectional bus.

According to the present invention, a method of operating a CAM system may include applying a request to a plurality of CAM devices arranged in series. The request may flow in one direction through CAM devices. Responses generated by CAM devices from a request may flow in the same one direction.

According to one aspect of the embodiments, in a CAM system operating method, requests may flow through each CAM device from an input port to an output port.

According to another aspect of the embodiments, in a CAM system operating method, responses may flow from one CAM device to the next. In particular, for CAM devices that are preceded by other CAM devices in the series, a CAM device may generate a response based on a local response generated from the CAM device and a remote response generated from a preceding CAM device in the series.

According to another aspect of the embodiments, in a CAM system operating method, requests may be branched to flow down two or more CAM device branches. A branching CAM can receive a request and provide such a request on two or more output ports.

According to another aspect of the embodiments, in a CAM system operating method, responses from two or more CAM device branches may be merged. A merging CAM can receive responses on two or more input ports, and generate a merged response based on such received responses.

DETAILED DESCRIPTION OF THE EMBODIMENTS

Various embodiments will now be described in conjunction with a number of diagrams. The embodiments set forth a CAM system and/or CAM device that may receive requests and generate responses to such requests.

Figure 1:
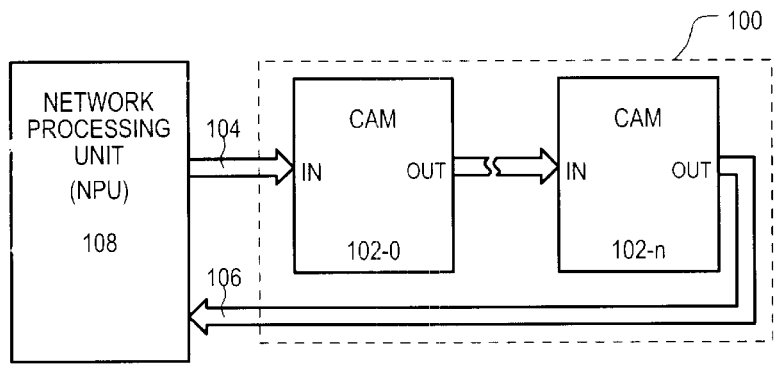
FIG. 1 is a block diagram of a content addressable memory (CAM) system according to a first embodiment.

Referring to FIG. 1, a first embodiment of a CAM system is set forth and designated by the general reference character 100. A first embodiment 100 may include at least two CAM components, which may be CAM devices (102-0 and 102-n) arranged in a cascade configuration. Unlike conventional approaches, a CAM system 100 may include an input connection 104 at a first CAM device 102-0 and an output connection 106 different from the input connection 104, at a last CAM device 102-n.

A CAM system 100 may receive input data, such as requests for searches or the like, and provide output data, such as search responses. In the arrangement of FIG. 1, a CAM system 100 may receive input data from a network processing unit (NPU) 108 via input connection 104 and provide output data to an NPU 108 via output connection 106. As is well understood such request issuing devices may be known as "host" processing components of a system.

Preferably, an input connection 104 and output connection 106 may be unidirectional. Thus, unlike conventional cascaded architectures, data may flow in a single direction through a CAM system 100. In particular, a request issued by a device, such as NPU 108, can flow through all CAM devices beginning with a first CAM device 102-0 and eventually to a last CAM device 102-n. In a similar fashion, a search response may flow from a first CAM device 102-0 and eventually to a last CAM device 102-n.

It is noted that by providing an essentially "one-way" flow for data, a cascaded system according to a first embodiment does not have to include circuits that replicate a duplex connection, as is the case for conventional cascaded architectures.

As will be described in more detail below, a CAM device may receive a search response from a previous CAM device in a cascade flow. A CAM device may compare its current search response with that of a previous CAM device in a flow, and generate an output response. Such an output response may be selected from between the previous and current search response and/or include a new, different response when the current and previous search responses have predetermined values.

Such an output search response may be provided to a next CAM device in a flow, or as an output value in the case of a last CAM device in a cascade flow. Thus, an output port 106 may provide a search response selected from, or generated in response to search responses for all CAM devices (102-0 to 102-n) in a system 100.

Figure 2:
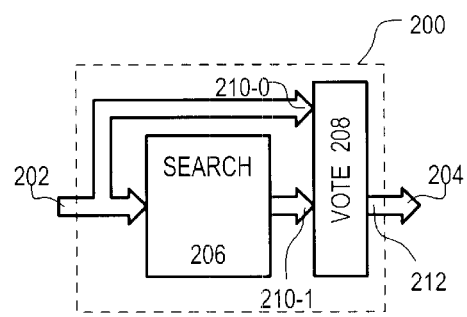
FIG. 2 is a block diagram of a CAM device according to one embodiment.

One example of a CAM device (that may serve as a CAM component in a system) according to a first embodiment is shown in FIG. 2 and designated by the general reference character 200. A CAM device 200 may include an input port 202, an output port 204, a search portion 206, and a vote portion 208. An input port 202 may preferably include a number of signal lines that receive input data, such as search or other types of requests from a requesting device or previous CAM device in a cascade. An input port 202 may be connected to a requesting device or previous CAM device in a "point-to-point" fashion. A point-to-point type connection may be an exclusive connection between two devices, as opposed to a shared bus. A point-to-point connection can be capable of transmitting data at a faster speed than a shared bus, as a point-to-point connection may present a smaller capacitive load than a shared bus.

An output port 204 may also include a number of signal lines for transmitting output data. Preferably, an output port 204 may essentially match an input port 202, and thus present a "point-to-point" connection. Such a point-to-point connection may be to a subsequent CAM device in a cascade, or in the event a CAM device 200 is the last device in a cascade, to an originally requesting device.

A search portion 206 may include circuits for performing one or more CAM related function. CAM related functions may include, without limitation, searches, reads, writes, parity checks, and "learns." A search operation can typically include applying a comparand value (also referred to as a key) to a number of data values stored in entries, or the like. According to such a comparison, a search portion 206 can generate a search response. Search responses may include a match when a key matches one entry, a multiple match, when a key matches multiple entries, and a miss, when a key doesn't match any entry. Typically, match responses may be generated when each bit of a key matches all bits of an entry, or when bits of a key match corresponding non-masked portions of an entry.

Read and write functions may read and write data to particular entries, respectively.

A parity check may include checking the parity of all or a portion of a CAM entry with an associated parity bit.

A learn function, may write a key value to an available entry in the event an initial search operation yields a miss response.

Preferably, a search portion 206 may be capable of generating additional search responses in the case of a miss. As but a few examples, a miss response may also indicate whether any entries are empty. More particularly, a miss response could also indicate if a single entry or some collection of entries (e.g., a block or sub-block) is free. Such a feature may be valuable for a subsequent learn operation.

Structurally, a search portion 206 may include some conventional circuit blocks. A command decoding portion may decode received requests. A search circuit may include multiple entries and circuits for comparing data in such entries to a key value. In particular embodiments, a search circuit may include one or more CAM cell arrays.

A vote portion 208 may include circuits for selecting between multiple search responses and/or circuits for generating a new response from predetermined received responses. In the example of FIG. 2, a vote portion 208 includes a first vote input 210-0 that receives a remote response, and a second vote input 210-1 that receives a local response. A remote response may be a search response generated from a previous CAM device in a cascaded chain. A local response may be a search response generated from a search portion 206. For selected types of responses, a vote portion 208 may select between such responses, and provide one such response at an output 212. For other types of responses, a vote portion may generate a different type of response, and provide such a different type of response at an output 212. One skilled in the art would recognize that the term "vote" is utilized in a generally descriptive sense, and should not be construed as limiting a vote portion to a particular circuit structure or method flow.

It is understood that a vote portion 208 may be simplified by constraining responses (e.g., remote and local) to arrive at the same time, or essentially the same time. However, one skilled in the art would recognize that a CAM device 200 could accommodate responses that do not arrive simultaneously. As but one very particular example, a CAM device 200 may include a buffer circuit or the like that could store a first arriving response. Such a response may be stored until a later second response. Upon receiving a second response, both a first and second response may be applied to a vote portion 208.

To better understand particular operations according to a first embodiment, an example of a request flow and response flow will now be described with reference to FIGS. 3A and 3B.

Figure 3A:
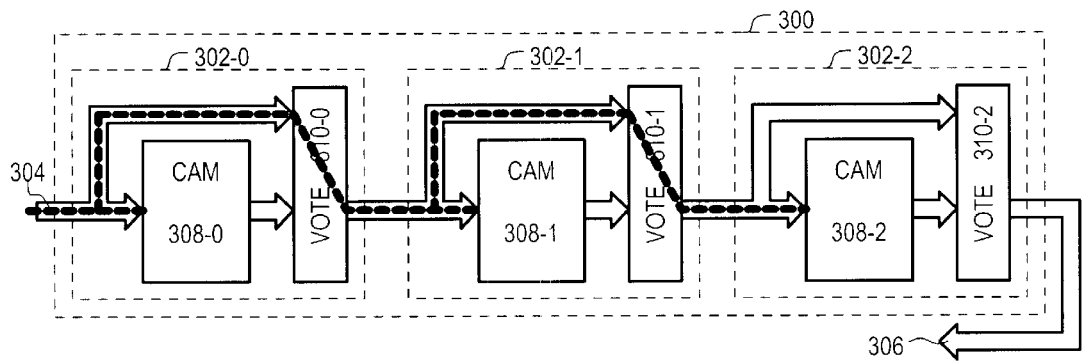
FIG. 3A shows a request flow according to first embodiment.
Figure 3B:
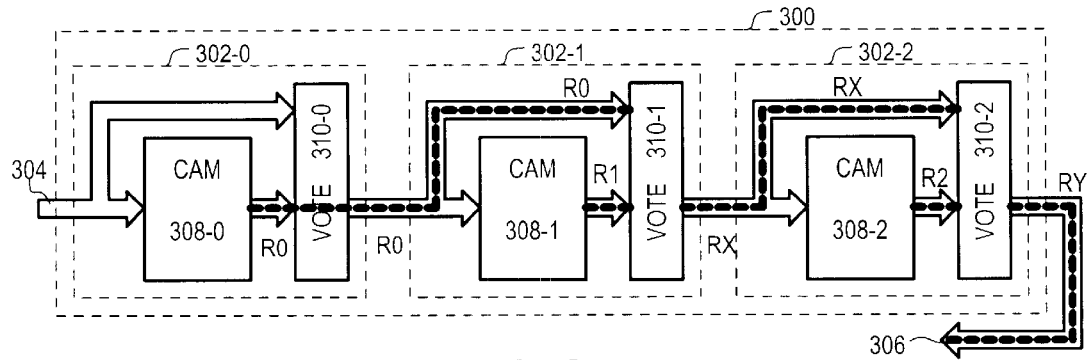
FIG. 3B shows a response flow according to a first embodiment.

Referring now to FIGS. 3A and 3B an example of a CAM system according to a first embodiment is set forth in a block diagram and designated by the general reference character 300. In the particular example of FIGS. 3A and 3B, CAM system 300 includes three CAM components, which may be CAM devices 302-0 to 302-2, arranged in a single serial cascaded. Thus, CAM device 302-0 may be a first CAM device and include an input port 304 that may receive requests. Similarly, a CAM device 302-2 may be last device and include an output port 306 that may provide a request response.

Each CAM device (302-0 to 302-1) can have the same general structure as that shown in FIG. 2. Thus, CAM devices 302-0 to 302-2 may include search portions 308-0 to 308-2, respectively, and vote portions 310-0 to 310-2, respectively.

FIG. 3A shows a request flow for a CAM system 300. In particular, a flow for a received request is represented by a bold and dashed line. As shown in FIG. 3A, a request may be received by a first CAM device 302-0 and input port 304. The request may then be applied to search portion 308-0. The same request may flow through a first CAM device 302-0 to a next CAM device 302-1. Like the first CAM device 302-0, within a second CAM device 302-1 the request may be applied to search portion 308-1 and the same request may flow through a second CAM device 302-1 to a next CAM device 302-2. In the example of FIG. 3A, a third CAM device 302-2 is a last CAM device. Consequently, a request may be applied to a search portion 308-2, and is not necessarily passed on to an output port 306.

In this way, a request may flow through cascaded CAM devices in a single flow direction.

FIG. 3B shows a response flow for a CAM system 300. In particular, a response flow generated in response to a received request is represented by a bold and dashed line. As shown in FIG. 3B, upon receiving a request, a search portion 308-0 within first CAM device 302-0 may generate a response, shown as R0. A response R0 may be applied to a next CAM device 302-1 in the cascade.

Within second CAM device 302-1, a response R0 may be applied to a vote circuit 310-1. In addition, in response to a same previous request, a search portion 308-1 within second CAM device 302-1 may generate its own response, shown as R1. Such a response is also applied to vote circuit 310-1. A vote circuit 310-1, according to predetermined criteria, may select between, or generate a new response based on the two received responses R0 or R1. A response provided by vote circuit 310-1 is shown as RX in FIG. 3B. Such a response RX may then be applied to any subsequent CAM device 302-2 in a cascade.

Within third CAM device 302-2, a response RX may be applied to a vote circuit 310-2. In the same general fashion as described above, a search portion 308-2 within third CAM device 302-2 may generate its own response, shown as R2. Such a response is also applied to vote circuit 310-2. A vote circuit 310-2 selects between, or generates a new response based on two received responses RX or R2, to provide output response RY.

In this way, multiple responses may be generated by cascaded CAM devices in response to a request. However, a single response may be output based upon predetermined criteria.

It is understood that the flows shown in FIGS. 3A and 3B should not be construed as exclusive in time. As but one example, while a request is still flowing through a subsequent CAM device, a first CAM device (such as 302-0) may have already generated a response.

Further, as noted above in conjunction with FIG. 2, while responses (e.g., R0 and R1 and/or RX and R2) may arrive essentially simultaneously, CAM devices (302-0 to 302-2) may include buffer or the like for accommodating responses that may arrive at different times to a same vote circuit (310-0 to 310-2).

While a first embodiment describes an arrangement that may allow for a serial cascading of CAM devices, it may be desirable to decrease a latency of a CAM system by allowing requests to be distributed to two or more devices. Such devices may process requests at essentially the same time. Accordingly, the present invention can also encompass cascaded CAM architectures that include one or more parallel branches. Such an embodiment will now be described with reference to FIGS. 4 and 5A to 5D.

Figure 4:
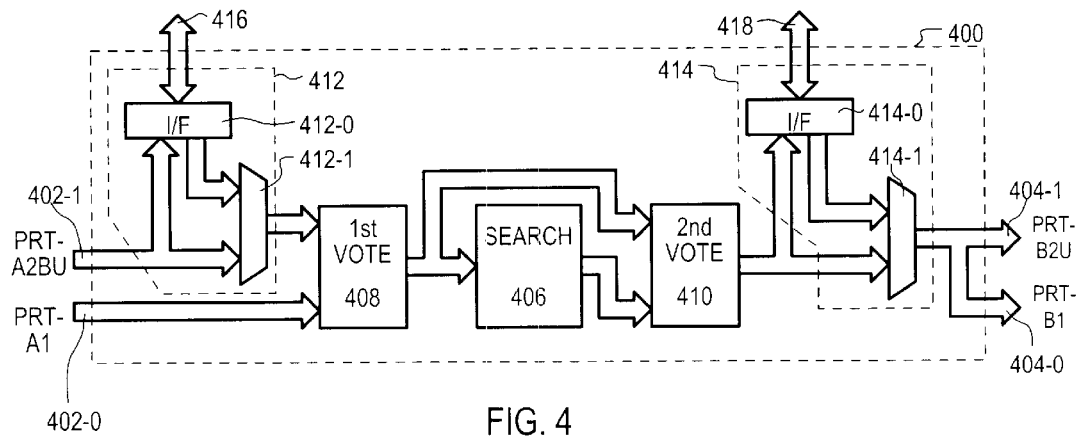
FIG. 4 is a block diagram of a CAM device according to a second embodiment.

FIG. 4 shows a CAM device according to a second embodiment. A CAM device is designated by the general reference character 400 and may include at least a first input port 402-0 and a second input port 402-1, and at least a first output port 404-0 and a second output port 404-1. A CAM device 400 may further include a search portion 406, a first vote portion 408, a second vote portion 410, a first interface portion 412, and a second interface portion 414.

Input ports (402-0 and 402-1) may essentially match one another in structure. Either input port (402-0 and 402-1) may receive a request from a previous CAM device or requesting device. In addition, each input port (402-0 and 402-1) may receive a different response from previous CAM devices in different legs of parallel cascade chains. Preferably, connections to input ports (402-0 and 402-1) are point-to-point.

Output ports (404-0 and 404-1) may both pass on a received request in a request flow. For example, a single response may be output on both output ports (404-0 and 404-1) and thus provide the ability to "branch" responses. Thus, first output port 404-0 may provide a request to one branch of parallel branches, and second output port 404-1 may provide the same request to another branch of the parallel branches.

A first vote portion 408 may receive multiple incoming responses and according to predetermined criteria, generate a response as an output. Such a response may then be applied to a second vote portion 410. In one particular arrangement, a first vote portion 408 may serve to pass on an incoming request to a search portion 406 and to a second vote portion 410. While multiple responses may preferably arrive at a first vote portion 408 at essentially the same time, a first vote portion 408 may include buffers to accommodate asynchronous response arrivals.

A search portion 406 can have the same essential structure as the search portion shown as item 206 in FIG. 2. Thus, a search portion 406 may receive a request and generate a local response.

A second vote portion 410 may have the same essential structure as the vote portion shown as item 208 in FIG. 2. Thus, a second vote portion 410 can receive a "remote" response from a previous CAM device in a cascade, as well as a local response from search portion 406. A second vote portion 410 may then provide one response to output ports (404-0 and 404-1). Like a first vote portion 408, a second vote portion 410 may include buffers to accommodate asynchronous response arrivals.

A first interface portion 412 may provide yet another connection to a CAM device 400. In the particular arrangement of FIG. 4, a first interface portion 412 includes an interface circuit 412-0 and multiplexer (MUX) 412-1. An interface circuit 412-0 may translate signals between a second input port 402-1 and a MUX 412-1 to a first secondary connection 416. Preferably, a first secondary connection 416 may be bi-directional. Thus, data may flow from a second input port 402-1 to a first secondary connection 416 and from a first secondary connection 416 to a MUX 412-1. As but two of the many possible examples, an interface circuit may provide an interface with predetermined bus types (e.g., PCI bus) and/or an interface with predetermined device types (e.g., memory devices, more particularly, static random access memories (SRAMs), even more particularly quad data rate QDR type SRAMs).

Within a first interface portion 412, a MUX 412-1 may select between signals from interface circuit 412-0 or second input port 402-1. In one arrangement, selection criteria for a MUX 412-1 may be established when a CAM device 400 is initialized. That is, upon initialization, a data value may be set in a CAM device 400 to control MUX 412-1 to provide either a path from second input port 402-1 to first vote portion 408, or from interface circuit 412-0 to first vote portion 408. Of course, while such a configuration may be established by an initialization step, other approaches would be obvious to one skilled in the art. As but a few of the many possible examples, a "mask" or fuse option can establish the configuration when the device is manufactured, or the configuration could be established "on the fly" by way of a specialized command, or the like.

A second interface portion 414 may include the same general components as a first interface portion 412, including an interface circuit 414-0 and multiplexer (MUX) 414-1. Interface circuit 414-0 may translate signals between an output of a second vote portion 410 and MUX 414-1, and a second secondary connection 418. Preferably, a second secondary connection 418 may be bi-directional. Thus, data may flow from a second vote portion 410 or interface circuit 414-0 to output ports (404-0 and 404-1). An interface circuit 414-0 and MUX 414-1 may be subject to the same variations as those described above for interface circuit 412-0 and MUX 412-1.

Figure 5A:
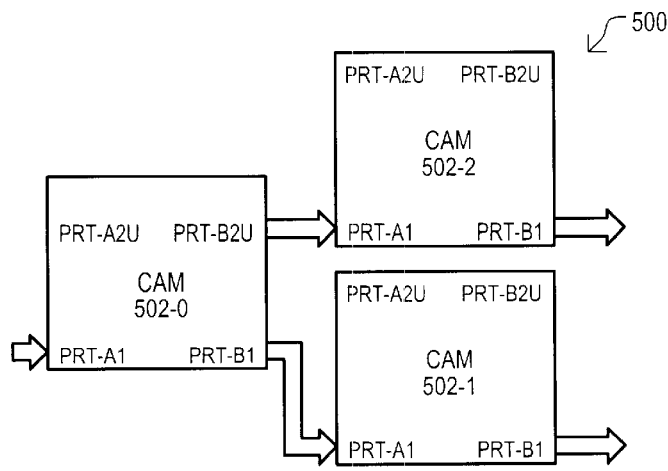
FIGS. 5A to 5D are block diagrams showing CAM device branching architectures and data flows according to one embodiment.
Figure 5B:
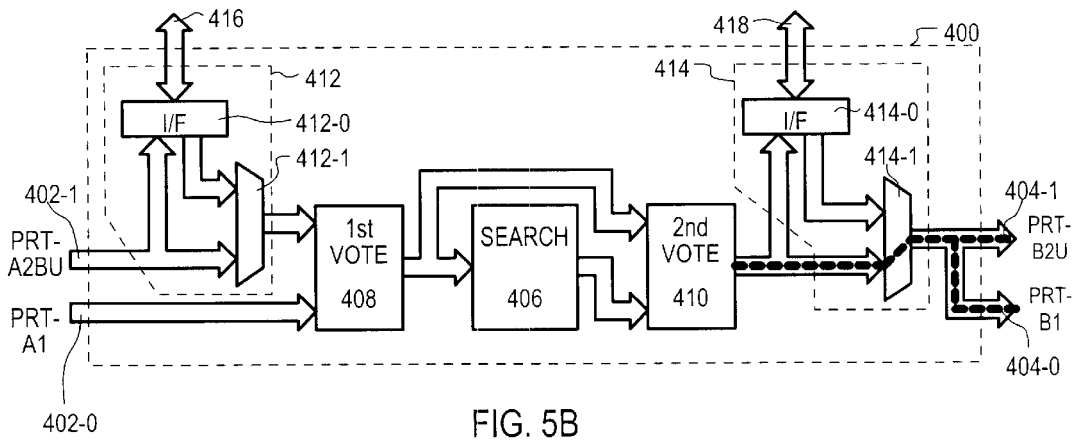
Figure 5C:
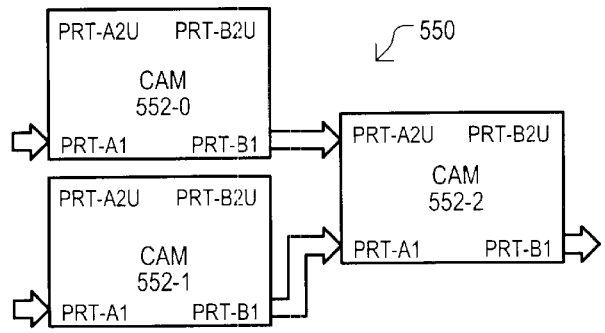
Figure 5D:
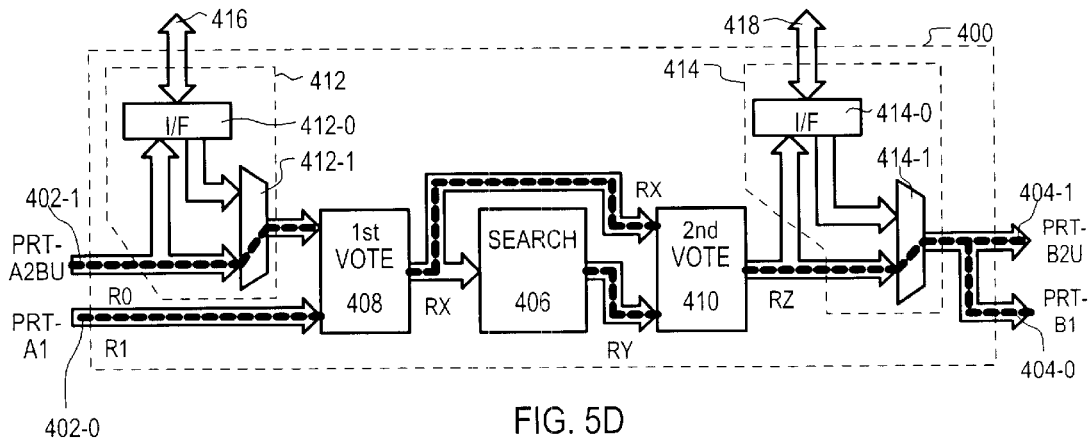

Various branching cases will now be describe with reference to FIGS. 5A to 5D. FIGS. 5A and 5B show the beginning of a cascade branch. FIGS. 5C and 5D show an end of a cascade branch.

Referring to FIG. 5A, a CAM system is designated by the general reference character 500 and is shown to include a "branching" CAM device 502-0, a first branch CAM device 502-1, and a second branch CAM device 502-2. A branching CAM device 502-0 may receive a request, and pass on such a request to both first and second branch CAM devices (502-1 and 502-2). Similarly, a branching CAM device 502-0 may generate a response, and pass such a response on to both first and second branch CAM devices (502-1 and 502-2).

In the particular example of FIG. 5A, it is assumed that a branching CAM device 502-0, first branch CAM devices 502-1, and second branch CAM device 502-2 have the same general structure as CAM device shown as 400 in FIG. 4. Thus, branching CAM device 502-0 has a first output port (PRT-B1) connected to a first input port (PRT-A1) of first branch CAM device 502-1, and a second output port (PRT-B2U) connected to a first input port (PRT-A1) of second branch CAM device 502-2.

A data flow for a branching CAM device, such as that shown as 502-0 in FIG. 5A, is shown in FIG. 5B. FIG. 5B shows a CAM device having the same arrangement as FIG. 4, thus like portions will be referred to by the same reference character.

In FIG. 5B, an output from second vote portion 410 (shown as bold and dashed lines) may flow through a second interface portion 414 to output ports 404-0 and 404-1. It is noted that such output data may include a request originally received at an input port (402-0, 402-1 or even from MUX 412-1) or a response generated by a second vote portion 410.

While the CAM system 500 shown in FIG. 5A shows an example of how a cascaded CAM system of the present invention may include the start of a branching chain, CAM system 550 of FIG. 5C illustrates how the present invention may include an end of a branching chain.

Referring to FIG. 5C, another CAM system is shown and designated by the general reference character 550. A CAM system 550 may include a first branch CAM device 552-0, a second branch CAM device 552-1, and a "merging" CAM device 552-2. A merging CAM device 552-2 may receive a response from both a first and second branch CAM device (552-0 and 552-1), and select from between, or generate a new response from such responses to provide a remote response. A merging CAM device 552-2 may further generate its own local response, and then select between, or generate a new response from the remote response and local response.

In the particular example of FIG. 5C, it is assumed that a first branch CAM device 552-0, second branch CAM devices 552-1, and merging CAM device 552-2 have the same general structure as CAM device shown as 400 in FIG. 4. Thus, first branch CAM device 552-0 has a first output port (PRT-B1) connected to a second input port (PRT-A2U) of a merging CAM device 552-2, and second branch CAM device 552-1 has a first output port (PRT-B1) connected to a first input port (PRT-A1) of a merging CAM device 552-2.

A data flow for a merging CAM device, such as that shown as 552-2 in FIG. 5C, is shown in FIG. 5D. FIG. 5D shows a CAM device having the same arrangement as FIG. 4, thus like portions will be referred to by the same reference character.

FIG. 5D shows an example of a response flow through a merging CAM device 400. A response flow is shown by a bold and dashed line. A merging CAM device 400 may receive a first response R0 (from a first branch CAM device, such as 552-0) at a first input port 402-0. A merging CAM device 400 may also receive a second response R1 (from a second branch CAM device, such as 552-1). A first vote portion 408 may select from between a first and second remote response (R0 or R1), or generate a new response according to predetermined criteria, and provide such a response at an output as a remote response RX.

Of course, while remote responses (R0 and R1) may preferably arrive at essentially the same time, asynchronous arrive of such response may be accommodated by buffering an earlier arriving response until a later response arrives.

A remote response RX may then be applied to a second vote portion 410. In addition, a local response RY, generated by a search portion 406 may also be applied to a second vote portion 410. A second vote portion 410 may then select between a remote response RX and a local response RY, or generate a new response and provide such a response as an output response RZ. An output response RZ may then flow through MUX 414-1 to one or both output ports (404-0 and/or 404-1). While responses may preferably arrive simultaneously, buffering may enable asynchronous arrival of responses at a second vote portion 410.

Of course, it is understood that first response R0, second response R1, and local response RY may all correspond to a common request previously applied to CAM devices in a system.

Within a CAM device, a search portion may be capable of searching key sizes that are larger than that typically provided by a single request. Thus, according to a third embodiment, multiple requests may be merged to enable wider key searches. One such example is described as a third embodiment in FIGS. 6 and 7.

Figure 6:
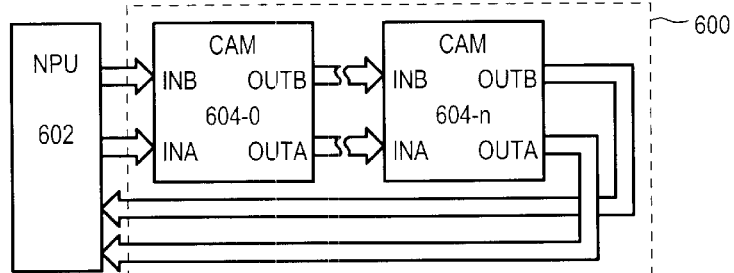
FIG. 6 is a block diagram of a CAM system according to a third embodiment.

FIG. 6 is a block diagram of a system according to a third embodiment. FIG. 6 shows a CAM system 600 and an associated request issuing device (or host processing component) 602, which may be an NPU. A CAM system 600 may include one or more CAM components, which may be CAM devices. The example of FIG. 6 shows a first CAM device 604-0 and a last CAM device 604-n.

Unlike previous examples, requests may be issued to a first CAM device 604-0 on multiple input ports. One request may include a first portion of a key while another request may include a second portion of the same key. Such key portions may be applied as a single key value within a CAM device (604-0 to 604-n).

Figure 7:
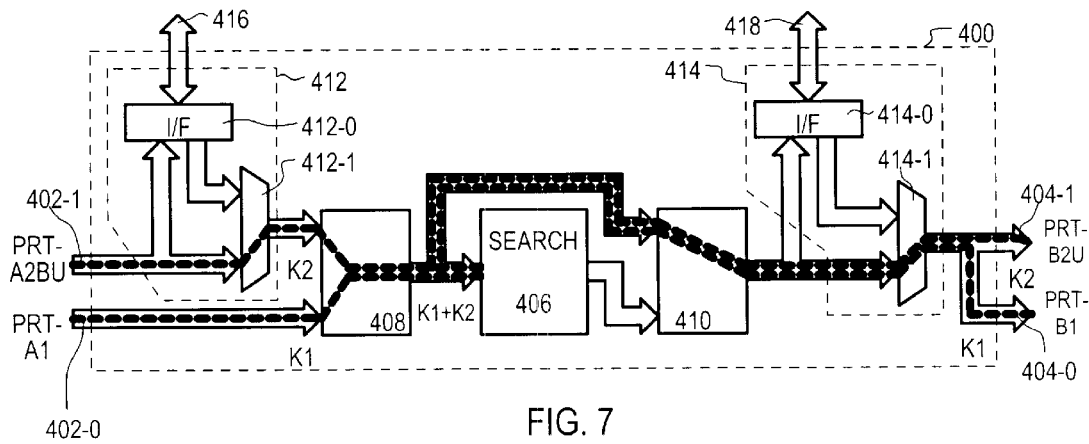
FIG. 7 is a block diagram of a CAM device data flow according to a third embodiment.

A data flow for CAM devices, such as those shown as 604-0 to 604-n in FIG. 6, is shown in FIG. 7. FIG. 7 shows a CAM device that may include some of the items as that shown in FIG. 4. Thus, like portions will be referred to by the same reference characters.

FIG. 7 shows an example of a "portioned" request flow through a CAM device 400. A portioned request flow is shown as two bold and dashed lines. A CAM device 400 may receive a first request at a first input port 402-0 and a second request portion at a second input port 402-1. A first request may include a first portion of a key K1. A second request may include a second portion of a key K2.

A first vote portion 408 may apply first and second key portions (K1 and K2) to a search portion 406 as portions of a single key value (K1+K2). It is noted that the application of multiple key portions (K1 and K2) need not be exactly in parallel. In one particular approach requests that carry key portions may be received on alternate timing cycles. Consequently, one portion of a key (e.g., K1) can be applied to a one part of a search portion 406 to generate "partial" match results. Subsequently, another portion of the same key (e.g., K2) can be applied to a second part of a search portion 406 to generate another partial match result. Partial match results may then be logically combined to generate an overall match result.

In this way, different portions of a search key may be applied over multiple input ports for application to a search portion of a CAM device. Such an approach may increase a rate at which searches are performed for keys having widths that may not be accommodated over a single input port.

While particular examples of branching architectures have been described above, the present invention also includes systems having multiple branches that are combined with one another to arrive at a system that provides for large search capabilities.

Various examples of such systems will now be described with reference to FIGS. 8A to 8C.

Figure 8A:
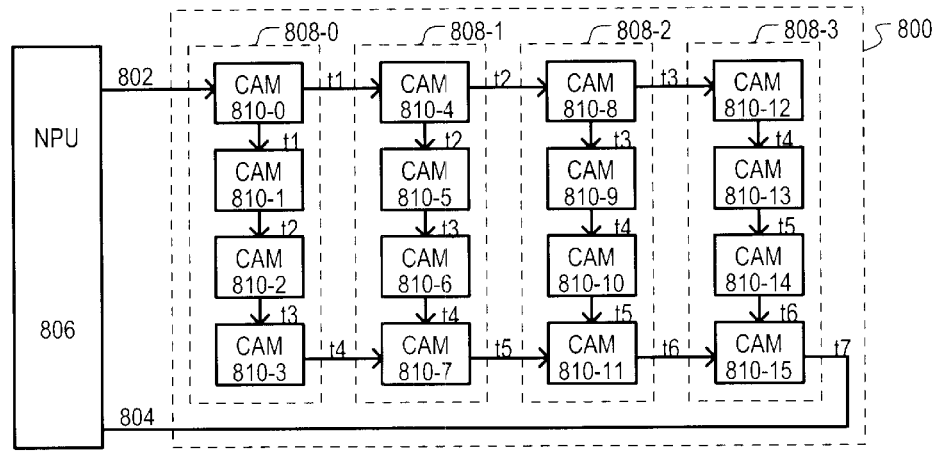
FIGS. 8A to 8C are block diagrams showing various embodiments of CAM systems that include multiple processing paths.

FIG. 8A shows a first example of a CAM system 800. A CAM system 800 may include at least one input port 802 and at least one output port 804. Processing requests may be received at an input port 802 and propagate through multiple CAM processing paths, each of which includes at least one CAM component. Responses corresponding to requests may be issued on at least one output port 804. In FIG. 8A, a CAM system 800 may receive requests from a host processing component, such as an NPU 806 and provide corresponding responses to an NPU 806.

In the particular example of FIG. 8A, a CAM system 800 includes four processing paths 808-0 to 808-3, and each processing path includes four CAM components, which may be CAM devices (810-0 to 810-15).

In a preferred embodiment, a processing path (808-0 to 808-3) may be a printed circuit board module, and CAM devices for a given processing path may take the form of one or more packaged integrated circuits. Of course, this preferred embodiment should not be construed as limiting the invention thereto. A system such as that shown in FIG. 8 may include CAM devices in a multi-device module, such as a multi-chip module, or the like. A system may also be integrated with an NPU or the like in a system-on-a-chip type application.

For all but a last processing path, a first CAM device may receive requests, and pass requests down its corresponding processing path and to a next processing path. Thus, CAM device 810-0 can receive a request from an NPU 806, and pass the request (and a following response) along to CAM device 810-1 (of its own processing path 808-0) and to CAM device 810-4. CAM device 810-4 can pass the same request (and a following response) to CAM devices 810-5 and 810-8. Similarly, CAM device 810-8 can pass the request (and a following response) on to CAM devices 810-9 and 810-12.

Preferably, CAM devices 810-0, 810-4, and 810-8 may all be branching CAM devices, such as that described in FIGS. 5A and 5B.

Just as the start of a processing path (808-0 to 808-3) may branch responses, an end of a processing path (808-0 to 808-3) may merge responses. Thus, for all but a first processing path, a last CAM device may receive multiple responses and generate its own response. The CAM device may then select one of the responses, or generate a new response according to predetermined criteria, and then pass the response on as an output value.

In the example of FIG. 8A, CAM device 810-7 can receive responses from CAM devices 810-3 and 810-6, and generate its own response. According to predetermined criteria, a CAM device 810-7 may select one of the responses, or generate a new response as an output to CAM device 810-11. CAM devices 810-11 and 810-15 will operate in a similar fashion, selecting from between two remote responses and one local response or generating a new response.

Preferably, CAM devices 810-7, 810-11, and 810-15 may all be merging CAM devices, such as that described in FIGS. 5C and 5D.

Various other devices may operate in the same general fashion as described for FIGS. 1 to 3B, selecting between a single remote response and a local response or generating a new response. As but two examples, a CAM device 810-1 may generate an output response according to a remote response from CAM device 810-0 and a locally generated response. Similarly, CAM device 810-10 may generate an output response according to a remote response from CAM device 810-9 and a locally generated response.

In a preferred approach, all CAM devices (810-0 to 810-15) may process incoming requests with a same latency. Similarly, all responses may be generated from a request with a like latency. Consequently, for an arrangement such as that shown in FIG. 8A, responses for a same request can arrive essentially simultaneously at input ports of the same CAM device. FIG. 8A includes a number of time indications (t1 to t7) to illustrate this point.

In FIG. 8A, exemplary time indications are shown as t1 to t7. These time indications can correspond to the propagation of a request and/or response to the same request. As is shown, at time t4, responses to the same request may be received at the input ports of CAM device 810-7. Similarly, responses to the same request may be received at input ports of CAM device 810-11 at time t5, and at input ports of CAM device 810-15 at time t6.

In this way requests and/or responses to the same request may propagate through multiple processing branches of CAM devices, and arrive at input ports of a merging CAM device at essentially the same time.

While FIG. 8A sets forth an example where processing may occur essentially simultaneously along multiple processing paths, one or more of such paths may be arranged in serial fashion. Such an arrangement is shown in FIG. 8B.

Figure 8B:
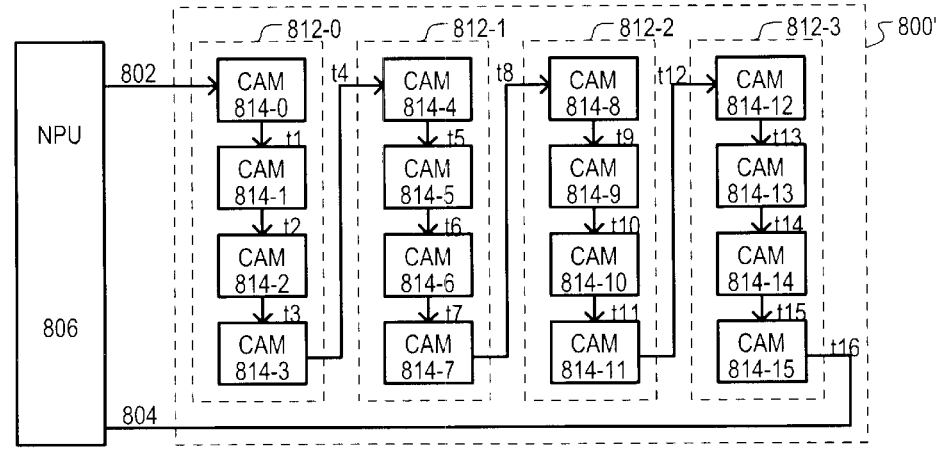

FIG. 8B may include some the same constituents as FIG. 8A. To that extent, like constituents are referred to by the same reference characters. A CAM system 800' may include at least one input port 802 for receiving requests and at least one output port 804 for providing responses. Unlike FIG. 8A, a CAM system 800' may include processing paths 812-0 to 812-3 that are arranged in series. Thus, a last CAM device 814-3 of processing path 812-0 may have an output port connected to an input port of a first CAM device 814-4 in a processing path 812-1. Remaining processing paths (812-2 and 812-3) may be connected in a like fashion.

It is noted that processing paths (812-2 and 812-3) can have the same structure as those shown as 808-0 to 808-3 in FIG. 8A, and subject to the variations noted for processing paths 808-0 to 808-3.

FIGS. 8A and 8B illustrate processing paths that include multiple CAM devices arranged in series. However, within a processing path, CAM devices may branch and merge. One example of such an arrangement is shown in FIG. 8C.

Figure 8C:
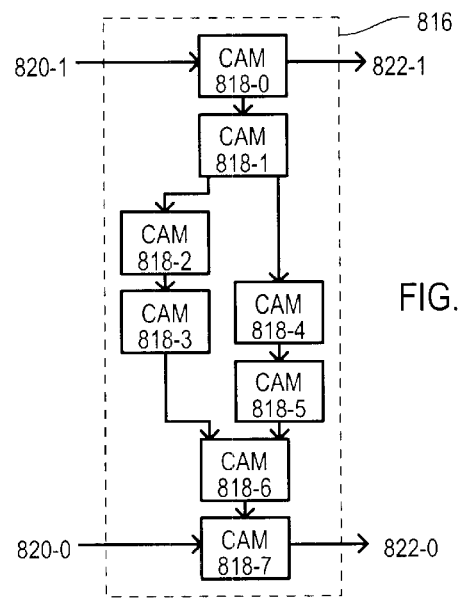

FIG. 8C is a block diagram showing a processing path 816 with branching and merging paths. In particular, a CAM device 818-1 may be a branching CAM device that receives requests and generates responses, and passes on such requests/responses to CAM devices 818-2 and 818-4. In addition, a CAM device 818-6 may be a merging CAM device that can generate an output response from a response provided by CAM device 818-3, a response provided by CAM device 818-5, and its own response. Such an output response may be provided as a remote response to CAM device 818-7.

The processing path 816 of FIG. 8C also illustrates how a processing path may include standardized input/output format. In particular, a processing path 816 may include two input connections 820-0 and 820-1, as well as two output connections 822-0 and 822-1. Such an arrangement can allow a processing path to be connected in any of the various arrangements described above.

Having described various CAM system structures, particular CAM architectures and operational timing for such architectures will now be described.

Figure 9A:
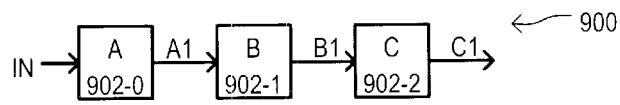
FIGS. 9A and 9B show a first CAM system architecture and timing according to the present invention.
Figure 9B:
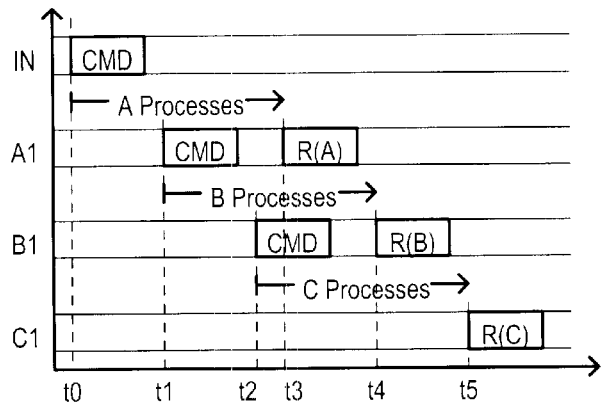

Referring now to FIGS. 9A and 9B, an example of a CAM system and timing for such a CAM system is shown. FIG. 9A is a block diagram of a single branch CAM system architecture 900. In FIG. 9A three CAM components are arranged in series: CAM device "A" 902-0, CAM device "B" 902-1, and CAM device "C" 902-2. CAM device A 902-0 may have an input port (IN) that receives requests. An output port of CAM device A 902-0 may be connected to an input port of CAM device B 902-1 on connection A1. Similarly, an output port of CAM device B 902-1 may be connected to an input port of CAM device C 902-2 on connection B1. A response may be provided from CAM device C 902-2 on a connection C1.

Each CAM device (902-0 to 902-2) may process requests and responses with the same latency. Thus, responses may follow requests on a same connection. Such an arrangement is shown in FIG. 9B.

FIG. 9B is a timing diagram showing an input port (IN), and connections A1, B1 and C1 described above. A typical request-response operation will now be described with reference to FIG. 9B.

At time t0, a request, shown as CMD (command), may be received at input port IN. Upon receiving request CMD CAM device A 902-0 may begin processing the request. Such a processing time is shown as "A Processes."

At time t1, the request CMD has propagated through CAM device A 902-0, even as CAM device A 902-0 is generating a response. Thus, the request CMD is transmitted on connection A1 to CAM device B 902-1. Upon receiving the request, CAM device B 902-1 also begins processing the request. Such a processing time is shown as "B Processes."

At time t2, the request CMD has propagated through CAM device B 902-1, even as CAM device B 902-1 is generating a response. CMD is thus transmitted on connection B1 to CAM device C 902-C. Upon receiving the request, CAM device C 902-2 can also begin processing the request CMD. Such a processing time is shown as "C Processes."

At time t3, CAM device A 902-0 completes a processing of request CMD, and generates a corresponding response R(A). Such a response R(A) may be sent to CAM device B 902-1 over a connection A1.

At time t4, CAM device B 902-1 completes a processing of request CMD, and generates an output response from a local internally generated response and remote response R(A). An output response can then be provided on connection B1 to CAM device C 902-2 as response R(B).

At time t5, CAM device C 902-1 completes a processing of request CMD, and generates an output response from a local internally generated response and remote response R(B). An output response can then be provided on connection C1 as response R(C).

It is noted that processing times for each CAM device can be essentially the same. Consequently, time amounts t5-t2, t4-t1 and t3-t0 may be essentially the same. Of course, such a feature may be arrived at by having all CAM devices in such a cascade be essentially identical. Internal CAM device operations may be timed according to a common clock signal, or the like.

Figure 10A:
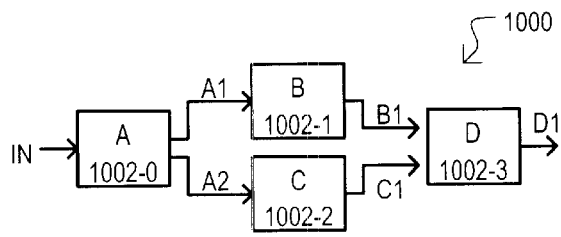
FIGS. 10A and 10B show a second CAM system architecture and timing according to the present invention.
Figure 10B:
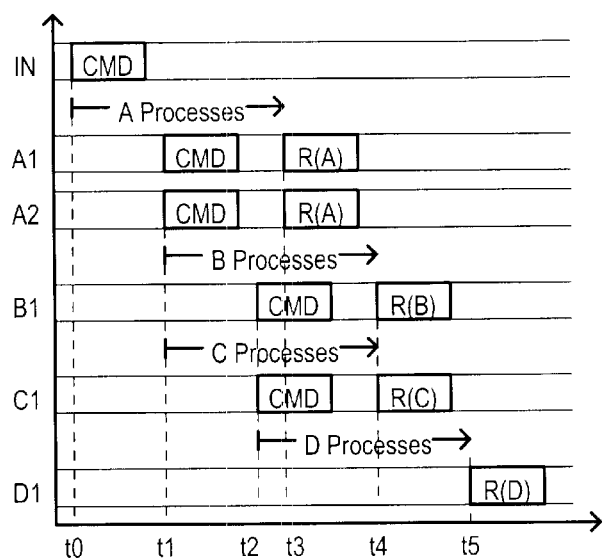

Referring now to FIGS. 10A and 10B, an example of a CAM system having multiple branches and the timing for such a CAM system is shown. In FIG. 10A, a CAM system 1000 can include various CAM components, including a branching CAM device "A" 1002-0, a second CAM device "B" 1002-1 that forms a first branch, a third CAM device "C" 1002-2 that forms a second branch, and a merging CAM device "D" 1002-3. A CAM device A 1002-0 may have an input port (IN) that receives requests. One output port of CAM device A 1002-0 may be connected to an input port of CAM device B 1002-1 on connection A1, another output port of CAM device A 1002-0 may be connected to an input port of CAM device C 1002-2 on a connection A2.

An output port of CAM device B 1002-1 may be connected to an input port of CAM device D 1002-2 on connection B1. Similarly, an output port of CAM device C 1002-2 may be connected to another input port of CAM device D 1002-2 on connection C1. A response may be provided from CAM device D 1002-3 on a connection D1.

As in the case of the example of FIGS. 9A and 9B, each CAM device in FIG. 10A (1002-0 to 1002-3) may process requests and responses with the same latency. Thus, requests may be transmitted over connections, and are followed by corresponding responses on the same connections.

It is understood that the particular example of FIG. 10B in which responses can be constrained to arrive at a voting circuit or section at essentially the same time. As noted above, a buffer or the like could store an earlier response until a delayed response is available. One skilled in the art would recognize that in such a case two different responses may arrive at separate times.

FIG. 10B is a timing diagram showing an input port (IN), and connections A1, A2, B1, C1 and D1 described above. A typically request-response operation will now be described with reference to FIG. 10B.

At time t0, a request, shown as CMD (command), may be received at input port IN. Upon receiving request CMD, branching CAM device A 1002-0 may begin processing the request. Such a processing time is shown as "A Processes."

At time t1, the request CMD has propagated through branching CAM device A 1002-0, even as CAM device A 1002-0 is generating a response. Thus, the request CMD is transmitted on connection A1 to CAM device B 1002-1 and on connection A2 to CAM device C 1002-2. Upon receiving the request, CAM devices B and C (1002-1 and 1002-2) can also begin to process the request. Such processing is shown as "B Processes" and "C Processes."

At time t2, the request CMD has propagated through CAM devices B and C (1002-1 and 1002-2), even as CAM devices B and C 1002-1 are generating a response. CMD is thus transmitted on connections B1 and C1 to CAM device D 1002-3. Upon receiving the request, CAM device D 1002-3 can also begin processing the request CMD. Such a processing time is shown as "D Processes."

At time t3, CAM device A 1002-0 completes a processing of request CMD, and generates a corresponding response R(A). Such a response R(A) may be sent to CAM devices B and C (1002-1 and 1002-2) over connections A1 and A2, respectively.

At time t4, CAM devices B and C (1002-1 and 1002-2) complete a processing of request CMD. Both CAM devices B and C (1002-1 and 1002-2) can select between a local internally generated response and remote response R(A), or generate a new response. CAM device B 1002-1 may provide an output response R(B) on connection B1 to CAM device D 1002-3. Similarly, CAM device C 1002-2 may provide an output response R(C) on connection C1 to CAM device D 1002-3.

At time t5, CAM device D 1002-3 can complete a processing of request CMD, and select between a local internally generated response and remote responses R(B) and R(C), or generate a new response. An output response can then be provided on connection D1 as response R(D).

In this way, a CAM system may include multiple branches in parallel, with each branch having one or more CAM devices. Results from such branches may be used to generate output responses in merging CAM devices. Such a parallel arrangement can allow for faster processing rates as requests may be processed by multiple branches in parallel. Still further, a number of branches can be expanded, allowing processing rates to scale up. However, overall latency between a request and response may remain the same (assuming all branches of a parallel group maintain the same latency).

The example of FIGS. 10A and 10B has shown a "matched timing" system. That is, provided each CAM device has the same processing latency, a responses generated on multiple branches (e.g., CAM devices B 1002-1 and C 1002-2) may arrive at a merging device (e.g., CAM device D 1002-3) at essentially the same time. This can enable a merging device to rapidly generate an output response (i.e., vote) from multiple responses.

However, the present invention may accommodate mismatched timing between branches. One such example is shown in FIGS. 11A and 11B.

Figure 11A:
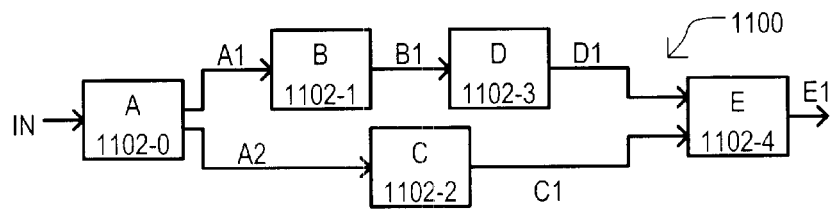
FIGS. 11A and 11B show a third CAM system architecture and timing according to the present invention.
Figure 11B:
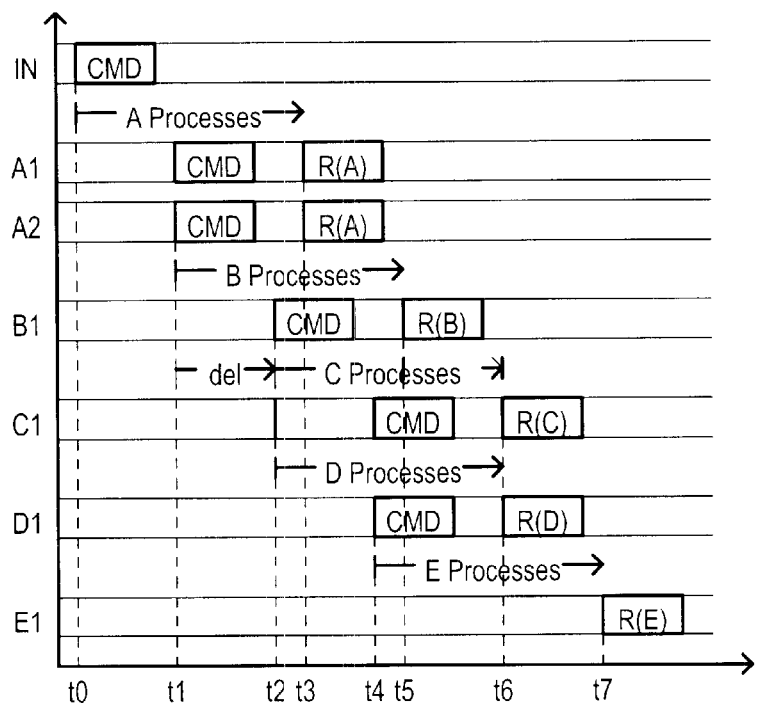

Referring now to FIGS. 11A and 11B, an example of a CAM system having multiple branches with different timings is shown. In FIG. 11A, a CAM system 1100 can include various CAM components, including a branching CAM device "A" 1102-0, a first branch that includes a CAM device "B" 1102-1 and a CAM device "D" 1002-3. A second branch may include CAM device "C" 1102-2. First and second branches may be merged at a merging CAM device "E" 1102-4.

A CAM device A 1102-0 may have an input port (IN) that receives requests. One output port of CAM device A 1102-0 may be connected to an input port of CAM device B 1102-1 on connection A1 and another output port of CAM device A 1102-0 may be connected to an input port of CAM device C 1102-2 on a connection A2.

An output port of CAM device B 1102-1 may be connected to an input port of CAM device D 1102-3 on connection B1. This may form a first branch that includes two CAM devices. An output port of CAM device D 1102-3 may be connected to an input port of merging CAM device E 1102-4 on connection D1.

CAM device C 1102-2 may form a second branch that includes one CAM device, and may have an output port connected to an input port of merging CAM device E 1102-4 on connection C1.

A response may be provided from CAM device E 1102-4 on a connection E1.

Unlike the example of FIGS. 10A and 10B, a total number of series connected CAM devices in each branch is different (a first branch has two devices, and a second branch has one device). Consequently, if each CAM device response is generated according to a same latency value, a response from a CAM device D 1102-3 would arrive at merging CAM device E 1102-4 at a different time than a response from a CAM device C 1102-2.

According to the embodiment of FIGS. 11A and 11B, a system may include a timing element to synchronize responses between branches that might otherwise have different processing latencies.

One particular approach is shown in FIG. 11B. In FIG. 11B a delay may be added to a response generated by a CAM device C 1102-2. Such a delay can ensure that a response from a CAM device C 1102-2 can be at one input port of merging CAM device E 1102-4 at essentially the same time a corresponding response from CAM device D 1102-3 is at another input port of merging CAM device 1102-4.

FIG. 11B is a timing diagram showing a request-response operation of the embodiment set forth in FIG. 11A. FIG. 11B shows signals at an input port (IN) and connections A1, A2, B1, C1, D1 and E1, described above.

At time t0, a request shown as CMD (command) may be received at input port IN. Upon receiving request CMD branching CAM device A 1102-0 may begin processing the request. Such a processing time is shown as "A Processes."

At time t1, the request CMD has propagated through branching CAM device A 1102-0 and is transmitted on connection A1 to CAM device B 1102-1 and to CAM device C 1102-2 on connection A2. Upon receiving the request, CAM devices B and C (1102-1 and 1102-2) can also begin to process the request. Such processing is shown as "B Processes" and "C Processes."

At time t2, the request CMD has propagated through CAM devices B and C (1102-1 and 1102-2). A request CMD is thus transmitted on connection B1 to CAM device D 1102-3. A CAM device D 1002-3 can receive a request CMD on connection B1 and begin processing to generate a response.

However, in FIG. 11B, a CAM device C 1102-2 of a "short" branch (i.e., a branch with fewer series connected CAM devices) may have a different overall latency than other CAM devices. In the particular example of FIG. 11B an overall latency for a CAM device C 1102-2 may be given by a total of "C processes" and a value "del." A C processes value can be a typical processing time for CAM device C 1102-2, and may be equal to processing times of other CAM devices in a system shown as "A processes," "B processes," etc. A value "del" may be delay introduced into a branch to account for processing differences between branches. Taking into account a compensating delay value "del," a CAM device C 1102-2 may not allow a request to propagate on to a connection C1 at time t2, but instead will delay such a request until a time t4.

It is understood that within a CAM device C 1102-2, a processing of a received response may be initially delayed by an amount "del," or a generated result may be held for a delay "del," or some proportional combination thereof may be employed to increase the overall latency of a CAM device branch with respect to other slower CAM device branches.

At time t3, a CAM device A 1102-0 completes a processing of request CMD, and generates a corresponding response R(A). Such a response R(A) may be sent to CAM devices B and C (1102-1 and 1102-2) over connections A1 and A2, respectively.

At time t4, a request CMD may finish propagating through a CAM device D 1102-3 and be issued on connection D1. At the same essential time, as noted above, a delayed request CMD may also be issued by CAM device C 1102-2 on connection C1.

At time t5, a CAM device B 1102-1 can complete a processing of request CMD, and generate a corresponding response R(B) on a connection B1. Such a response R(B) can thus be received by a CAM device D 1102-3.

At time t6, CAM device D 1102-3 can complete a processing of request CMD and selects between a local internally generated response and remote response R(B), or generates a new response. CAM device D 1102-3 may provide an output response on connection D1 as response R(D).

Also at time t6, a CAM device C 1102-2 can have completed a processing of a request CMD. CAM device C 1102-2 may select between a remote response R(A) received on connection A2 and a locally generated response, or generate a new response. Such a response may be issued on connection C1 as response R(C). It is noted that response R(C) may have been generated earlier and simply delayed to correspond with response R(D).

At time t7, CAM device E 1002-4 can complete a processing of request CMD, and select between a local internally generated response and remote responses R(C) and R(D), or generate a new response. A selected response can then be provided on connection E1 as response R(E).

Of course, a delay, buffer and/or latch may be introduced into a branch through any of a number of ways. A delay, buffer and/or latch may be introduced within a CAM device of a branch, for example, or accounted for by a merging CAM device, or introduced by a circuit element separate from the CAM devices of a cascade chain. Of course, these are but a few of the possible approaches.

Referring back to FIG. 4, to account for mismatched branch timing within a CAM device of a faster processing branch, a first vote circuit 408 may be configured to delay the application of a request to a search portion 406 and/or to output ports (404-0 and 404-1). In addition or alternatively, a second vote portion 410 may delay a request propagating through a CAM device 400 and/or a response generated from selecting between a remote response and local response.

A merging CAM device may account for mismatch timing in multiple branches by storing a first received remote response in a first vote portion for comparison with a subsequent second received remote response. This may enable the two responses to be compared with one another. In the case of requests, requests from one branch (the faster branch) may be ignored, or delayed to coincide with request received from a slower branch.

In this way, a CAM system may include multiple branches in parallel, with one or more branches having a different number of series connected CAM devices, or other aspects that result in mismatch processing latencies between branches. Processing may be delayed on a faster branch to enable requests and/or response to be issued essentially simultaneously from such branches.

Figure 12:
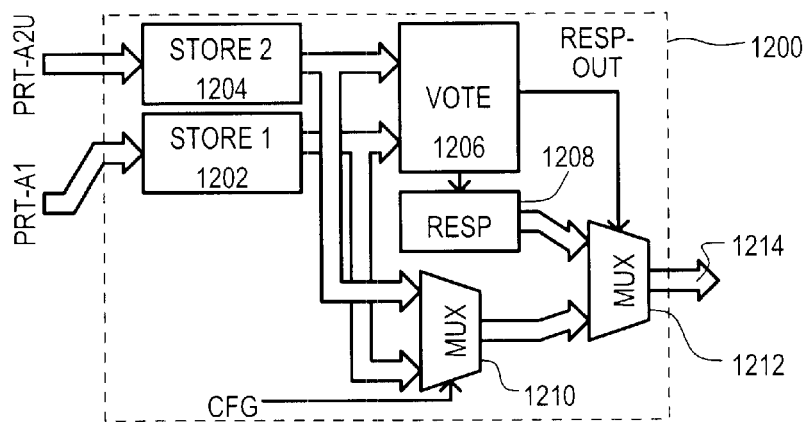
FIG. 12 is a block diagram of a vote portion of a CAM device according to one embodiment.

Referring now to FIG. 12, a vote portion of a CAM device according to one embodiment is set forth in a block schematic diagram. A vote portion may correspond to a first vote portion and/or second vote portion, such as those shown as items 408 and 410, respectively, in FIG. 4. As shown in FIG. 12, a vote portion is designated by the general reference character 1200 and may include a first input store 1202, a second input store 1204, a vote circuit 1206, a response store 1208, a forwarding multiplexer (MUX) 1210, a vote MUX 1212, and an output path 1214.

First and second input stores (1202 and 1204) may store all, or selected portions of an input request and/or response generated from a request. For example, if a vote portion 1200 is a first vote portion (like that shown as 408 in FIG. 4), an input store (1202 and/or 1204) may store a request received from an issuing device (e.g., an NPU), either directly, or indirectly by way of a previous CAM device in a cascade. In addition, an input store (1202 and/or 1204) may receive a response from a previous CAM device in a cascade. Of course, if an input port corresponding to an input store (1202 and/or 1204) is not connected to another device, the input store (1202 and/or 1204) may store no valid data.

As another example, if a vote portion 1200 is a second vote portion (like that shown as 410 in FIG. 4), a first input store 1202 may store a local response generated from a search portion (e.g., item 406 in FIG. 4), while a second input store 1204 may store a remote response generated from a previous CAM device in a cascade arrangement.

In one very particular embodiment, requests and responses may take the form of data packets. Input stores (1202 and 1204) may buffer such packets, and forward one or the other according to predetermined criteria.

A vote circuit 1206 may receive all, or preferably selected portions of data stored in inputs stores (1202 and 1204). According to such data, a vote circuit 1206 may select or generate a summary response (e.g., a response based on two received responses) at response store 1208. In addition, a vote circuit 1206 may generate a result RESP-OUT that can indicate a voting operation is complete.

A forwarding MUX 1210 may be preconfigured to forward received requests from either input store (1204 or 1202). In FIG. 12, a signal CFG may control an operation of a forwarding MUX 1210.

A vote MUX 1212 may be controlled by a result RESP-OUT. Thus, if a response is not ready, an output from a forwarding MUX 1210 may be provided on output path 1214. However, if a result RESP-OUT indicates a response is ready, a vote MUX 1212 may output a summary response, which can be a response based on two received responses.

Figure 13:
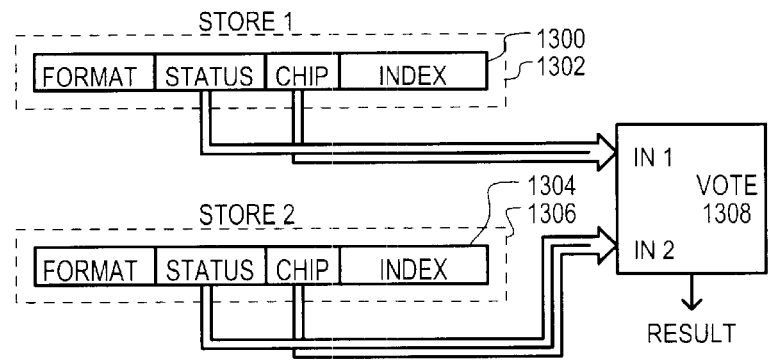
FIG. 13 shows one example of a CAM device voting circuit according to an embodiment.

Referring now to FIG. 13, one example of a vote circuit operation is illustrated. FIG. 13 includes first response data 1300 stored in a first store 1302, second response data 1304 stored in a second store 1306, and a vote circuit 1308. Response data (1300 and 1304) may have a predetermined format. In the example of FIG. 13, response data includes a format field, a status field, a chip field, and an index and/or data field. A format field may define the format of a response (e.g., number of bytes in the response, etc.). A status field can indicate the precedence of a response with respect to other types of responses.

As but a few examples, the following responses may have a precedence reflected by order, highest to lowest: multiple match, single match, no match with free entry, no match with sub-block of free entries (sub-block includes multiple entries), no match with block of free entries (block includes multiple sub-blocks). Of course, while such particular responses and precedence may be particularly advantageous in some systems, such responses should not necessarily be construed as limiting the invention thereto. In one particular approach, status values may be binary numbers having magnitudes that reflect their corresponding precedence. All or a portion of such values may be programmable. In addition, or alternatively, all or a portion of such values may be based on hardware within a CAM device (e.g., based on an address).

A chip field can identify a particular chip (e.g., CAM device) that generates a response. Chip fields are preferably unique, and can reflect a device precedence.

A data field may store data associated with a response. As but one very limited example, such data may include an index (key) value that generates a response and/or data associated with a response.

Referring again to FIG. 13, a vote circuit 1308 may include a first input IN1 that may receive selected portions of first response data 1300 and a second input IN2 that may receive selected portions of a second response data 1304. In one very particular approach, a vote circuit 1308 may include a magnitude comparator circuit that receives status fields and chip fields and a comparator that receives at least status fields. Thus, if a status field of one response data (1300 or 1304) has a higher precedence than the other (1304 or 1300), a magnitude comparator may generate a result RESULT that may indicate the higher precedence response data. If however, the status fields have a one or more predetermined special values, a comparator or other circuit may detect this, and output a RESULT that overrides or supplements a result from a magnitude comparator and indicates new response data. If the status fields of response data (1300 or 1304) are equal to one another but do not have the predetermined special values, a chip field may determine which response has higher precedence.

As but one very particular example, a status field may indicate the following responses: multiple match, single match, no match with free entry, no match with sub-block of free entries, no match with block of free entries. If two responses are not both "single match", then a magnitude comparator may essentially select an output response according to a higher magnitude response, including a chip field if other fields are identical. However, two input responses that indicate a single match may represent predetermined special values that generate a response not strictly based on a magnitude comparison. Thus, a comparator may override or supplement any magnitude comparator output, and generate a new "multiple match" response as an output. In this way, a vote circuit may generate an output response from two responses according to precedence values associated with each response and predetermined special values.

Having described the general operation of CAM devices according to various embodiments, methods of operation will now be described with reference to FIGS. 14A and 14B.

Figure 14A:
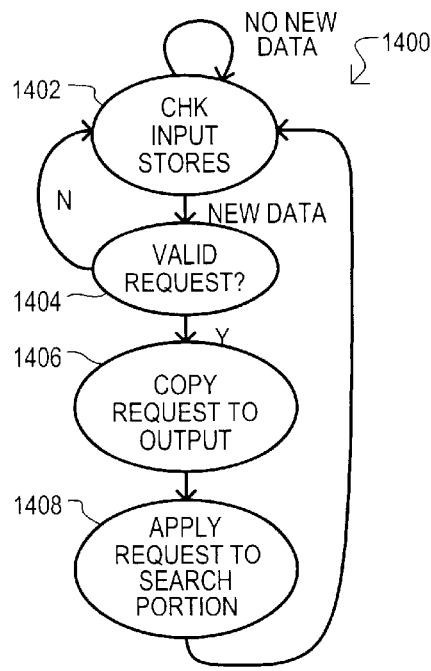
FIGS. 14A and 14B are state diagrams illustrating request and response operations for a CAM device according to an embodiment.
Figure 14B:
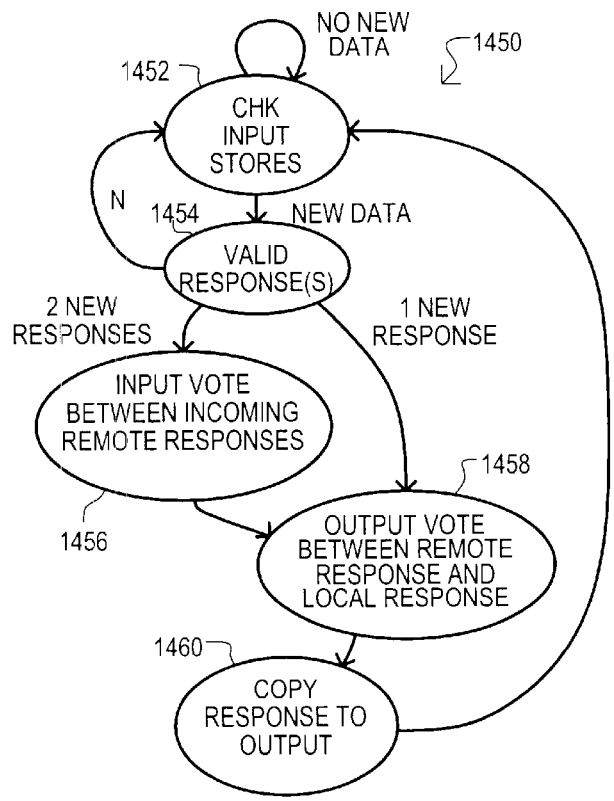

FIGS. 14A and 14B are state diagrams showing a "request" operation and a "response" operation, respectively, of a CAM device.

Referring to FIG. 14A, a request operation is designated by the general reference character 1400 and may include checking input stores 1402. Such a step may be periodically executed according to system timing to coincide with the arrival of new responses. In addition or alternatively, such a step may also be dependent upon receiving circuits that may flag when a complete request has been stored. If a step 1402 indicates new data has been received, a request operation 1400 may proceed to checking for a valid request 1404. If new data has not been received, a request operation 1400 may return to a step 1402.

Checking for a valid request 1404 may include examining fields of data for predetermined values. If new data is a valid request, a request operation 1400 may copy the request to an output 1406. If new data is not valid, a request operation 1400 may return to a step 1402 (error messages could also be generated).

Copying a request to an output 1406 may include copying all or a portion of a received request to an output port. In this way, a request may propagate through a CAM device to another CAM device in a cascade, or to a requesting device such as an NPU, or the like.

A requesting operation 1400 can also include applying a valid request to a search portion 1408. For search related requests, such a step may include applying a key value to search portions of a CAM device. For read or write related requests, such a step may include writing data to one or more entries in a search portion or reading data from one or more entries of a search portion. For control related requests, such a step may include setting register values in CAM device. Of course, such operations are exemplary, and should not be construed as limiting the invention thereto.

Of course, the various steps shown in FIG. 14A can be subject to variation. As but one of the many possible variations, steps 1406 and 1408 may be executed in parallel or reverse order.

In this way, a request operation may be executed in a CAM device.

Referring now to FIG. 14B, a response operation is designated by the general reference character 1450 and may include checking input stores 1452. Such a step may essentially be like step 1402 of FIG. 14A. If a step 1452 indicates new data has been received, a response operation 1450 may proceed to checking for a valid response 1454. If new data has not been received, a response operation 1450 may return to a step 1452.

Checking for a valid response 1454 may be essentially the same as step 1404 of FIG. 14A. If the new response(s) are not valid, a response operation 1450 may return to a step 1452 (error messages could also be generated).

As shown in FIG. 14B, if two new responses are received, such responses can be considered "remote" responses, and a response operation 1450 may "input" vote between the two remote responses 1456. Such an operation may yield a single remote response, and a process may continue to an output vote step 1458.

If one new response is indicated by a step 1454, such a response can be considered a remote response, and a response operation may proceed to output vote step 1458.

An output vote step 1458 may include voting between a single remote response and a locally generated response (a response from a search portion on the device). Such an operation may yield a single output response.

Following the generation of a single output response at step 1458, a response operation 1450 may copy such an output response to an output 1460. Such an operation may provide a response as a remote response to a next CAM device in a cascade configuration, or as an overall system response to a requesting device, such as an NPU or the like.

In this way, a response operation may be executed in a CAM device.

The present invention has been described in various systems that may include one or more CAM devices. However, other embodiments may include CAM devices in combination with other such devices. On such example will now be described with reference to FIGS. 15A to 15C.

Figure 15A:
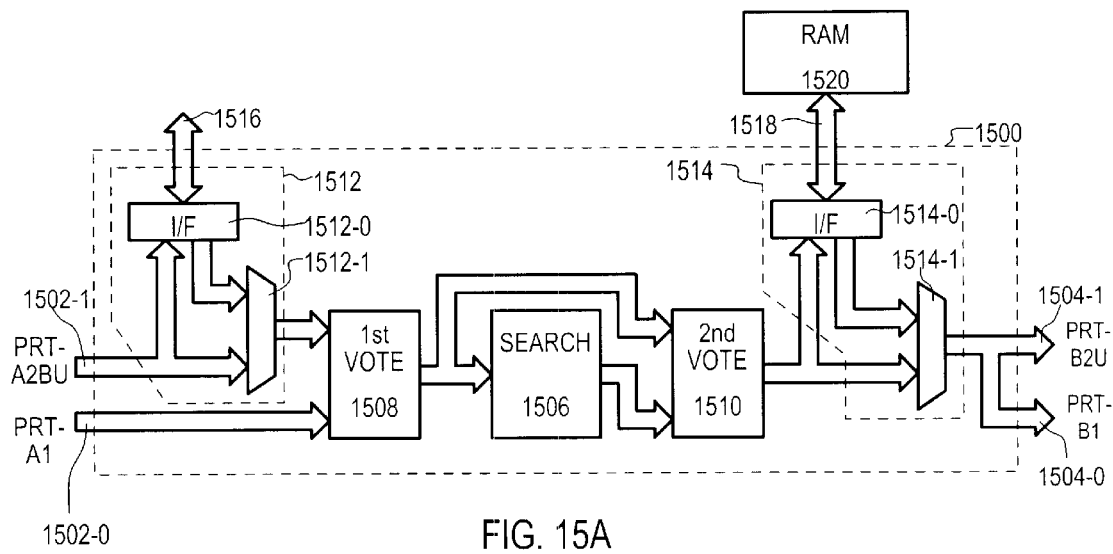
FIGS. 15A to 15C are block diagrams and timing diagrams illustrating CAM device connections to a RAM according to one embodiment.

FIG. 15A shows an example of CAM component, which may include CAM device 1500, connected to a memory device 1520. A CAM device 1500 may include some of the same basic structures as the CAM device shown as 400 in FIG. 4. To that extent, like structures will be referred to by the same reference character but with the first digit being a "15" instead of a "4."

In FIG. 15A, a memory device 1520 may be connected to a CAM device 1500 by way of one or more secondary connections. FIG. 15A particularly shows a random access memory (RAM) 1520 coupled to CAM device 1500 at second secondary connection 1518.

In the example of FIG. 15A, second secondary connection 1518 may be a bi-directional connection. Further, interface circuit 1514-0 may send commands to a memory device 1520 and receive data from a memory device. More particularly, a memory device 1520 may receive commands via a second vote portion 1510, where such commands can originate from a first vote portion 1508 and/or a search portion 1506. Commands from a first vote portion 1508 may be "remote" commands received by way of an input connection (e.g., 1502-0, 1502-1, and 1516).

Thus, in an arrangement such as that shown in FIG. 15A in response to a request, a search portion 1506 may generate a response, and in addition, a memory device request for a memory device. In response to a memory device request, a memory device 1520 may generate a memory device response. A memory device response may be appended to or overwrite an initial response from a search portion 1506.

Figure 15B:
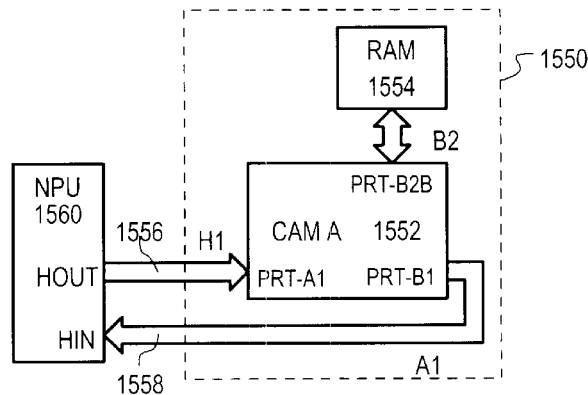

FIG. 15B is a block diagram showing an example of a CAM system that also includes a memory device. In FIG. 15B a CAM system is designated by the general reference character 1550 and may include one or more CAM devices 1552 and a RAM 1554 connected to a CAM device 1552. A CAM system 1550 may receive requests from an input port 1556 and provide responses at an output port 1558. Preferably, an input port 1556 may be a unidirectional point-to-point connection from a requesting device, such as an NPU 1560. Similarly, an output port 1558 may preferably be a unidirectional point-to-point connection from a CAM system 1550 to a requesting device 1560.

Like previously described examples, requests may flow through a CAM system 1550 in a single direction, and corresponding responses may flow through a CAM system 1550 in the same direction. However, unlike other described embodiments, in the examples of FIGS. 15A to 15C, a memory device (1520 or 1554) may provide additional data that is overwritten or appended to a response generated by a search portion (1506).

In FIG. 15B, a CAM device "A" 1552 may have a first input connection (PRT-A1) connected input port 1556. In addition, a CAM device A 1552 may be connected to a RAM device 1554 by way of a second secondary connection (PRT-B2B). A secondary connection (PRT-B2B) may be bidirectional. A CAM device A 1552 may have a first output connection PRT-B1 connected to output port 1558.

A general operation of a CAM system, like that shown in FIG. 15B, will now be described with reference to FIGS. 15B and 15C.

Figure 15C:
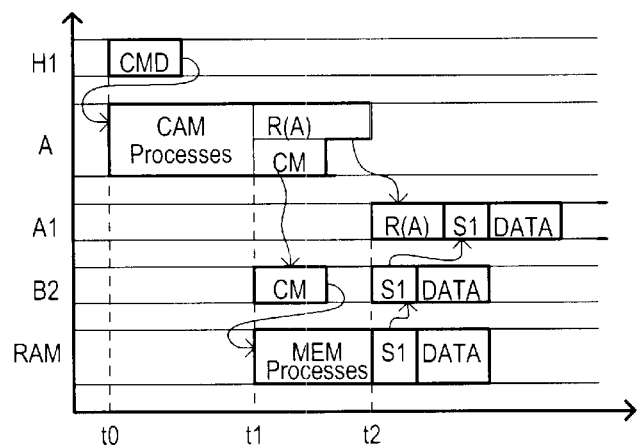
Figure 16:
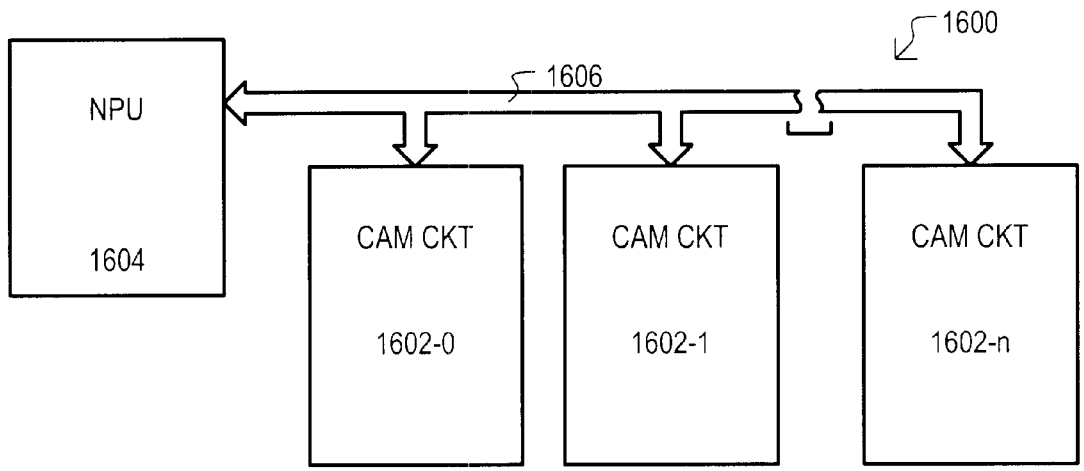
FIG. 16 is a block diagram of a first conventional CAM system.
Figure 17:
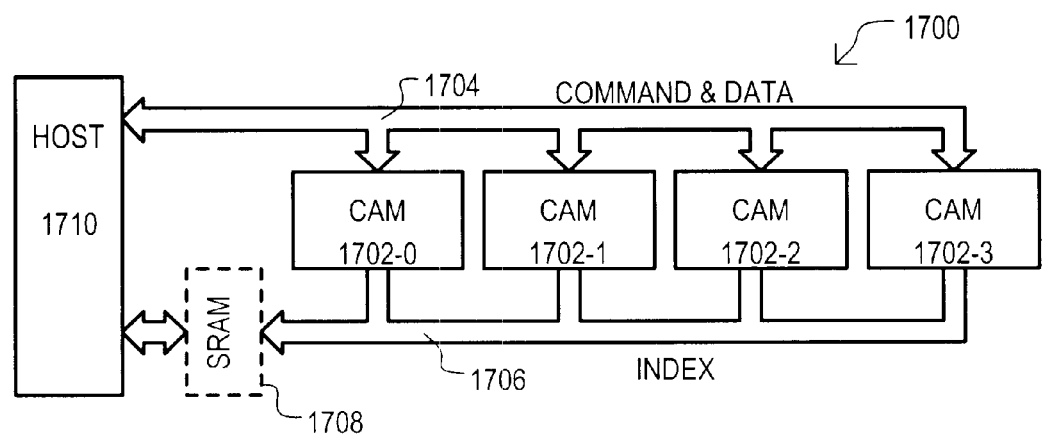
FIG. 17 is a block diagram of a second conventional CAM system.

FIG. 15C is a timing diagram showing a request and corresponding response operation for a system such as that shown in FIG. 15B. FIG. 15C includes waveforms "H1," "A," "A1," "B2," and "RAM." Waveform H1 can represent requests issued by a requesting device NPU 1560. Waveform A can represent internal operations of CAM device A 1552. Waveform A1 can represent signals on first output connection PRT-B1. Waveform B2 can represent signals on second secondary connection PRT-B2B. Waveform RAM can represent operations within memory device 1554.

Referring now to FIGS. 15B and 15C, at a time t0 a requesting device (NPU 1560) may issue a request (CMD) on an input connection 1556. The request may be received at input connection PRT-A1 of CAM device A 1552. CAM device A 1552 may begin processing the requests (shown as "CAM Processes"). It is understood that a CAM device A 1552 could pass along a request CMD at an output connection if there were other CAM devices in a cascade.

At time t1, a CAM device A 1552 may complete processing a request and generate a result R(A). However, unlike previous examples, a CAM device A 1552 may also generate a memory device command CM. As shown in FIG. 15C, such a memory device command CM may be issued on second secondary connection PRT-B2B to memory device 1554. Within a CAM device A, result R(A) may be output and/or retained to be output at a later time.

The memory command CM may be received by a memory device 1554. A memory device A 1552 may then begin to process the memory device command (shown as "MEM processes").

At around time t2, a CAM device A 1552 may issue a response R(A) on output connection A1. In addition, a memory device 1554 may generate a memory device response "S1" and associated data "DATA." As shown in FIG. 15C, such a response and DATA may be "appended" onto response R(A) generated by a CAM device A 1552.

Appending of additional responses and data from other devices, such as a memory device 1554, may occur in a various ways. As but three examples, appending may include issuing such additional commands after a response, or storing an initial CAM response and additional responses together, and outputting all in a single packet. Still further, a CAM response may be stored. Additional responses may then overwrite all or a portion of the original response (e.g., a response R(A) may be initially stored, and then a memory device response S1 and/or its associated data DATA may overwrite all or portions of response R(A)).

In this way a CAM system may include other types of devices that may work in conjunction with CAM devices.

It is understood that while the embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A content addressable memory (CAM) system comprising:

a plurality of content addressable memory (CAM) devices arranged in a series including a first CAM device having at least one input port for receiving an operation request and a last CAM device having at least one output port for providing a response to the operation request based on responses for the plurality of CAM devices; wherein each CAM device includes a first vote portion that generates a first vote output response from a local response generated by a search portion internal to the CAM device and a remote response received at the at least one input port of the CAM device, the first vote portion generates a first vote output response according to at least predetermined precedence data associated with each response.

2. The CAM system of claim 1, wherein:

each CAM device includes an input port, an output port, and a request path between the input port and the output port for passing requests between the input port and the output port.

3. The CAM system of claim 1, wherein:

each CAM device includes a second vote portion that generates a second vote output response based on at least two remote responses received at different input ports of the CAM device.

4. The CAM system of claim 1, wherein:

the plurality of CAM devices includes at least one branching CAM device that receives requests at the at least one input port and provides such requests on at least two output ports.

5. The CAM system of claim 1, wherein:

the plurality of CAM devices includes at least one merging CAM device that receives remote responses on at least two input ports, and generates an output response based on at least the remote responses to provide a single response at one output port.

6. The CAM system of claim 1, wherein:

each of the plurality of CAM devices generates a response to the request with a same predetermined latency.

7. A content addressable memory (CAM) device, comprising:

a search portion that receives an operation request and generates a local response to the operation request; and at least a first vote portion that generates a fist vote output response from the local response and a remote response to the same operation request received at an input port of the CAM device and includes a vote circuit that selects between the local response and remote response according to predetermined precedence values.

8. The CAM device of claim 7, wherein:

the vote circuit includes a magnitude comparator that compares at least a portion of the local response with a portion of the remote response.

9. The CAM device of claim 8, wherein:

the magnitude comparator compares portions of the local and remote response that are selected from the group consisting of a precedence value associated with a particular response type, a device identification value associated with a CAM device that originally generates the response, a programmed priority level, or a hardware associated priority value.

10. The CAM device of claim 7, further including:

a second vote portion that that generates a second vote output response based on at least two remote responses to the same operation request received at input ports of the CAM device.

11. The CAM of claim 7, further including:

at least a first interface portion that includes a multiplexer for selecting between a secondary port and an output from a first vote portion.

12. The CAM of claim 11, wherein:

the first interface portion further includes all interface circuit coupled between the multiplexer and the secondary port that transfers data between one clock domain and another clock domain.

13. A method of operating content addressable memory (CAM) devices in a CAM system, comprising the steps of:

applying an operation request to a plurality of CAM devices arranged in series in a single direction relative to the series arrangement; and generating responses to the operation request in the single direction; wherein applying the operation request includes branching an operation request with a branching CAM device that receives the operation request at an input port of the branching CAM device and provides the response to at least two output ports of the branching CAM device.

14. The method of claim 13, wherein:

applying the operation request includes receiving the operation request at an input port of each CAM device and providing the operation request to at least one output port of the CAM.

15. The method of claim 13, wherein:

if a CAM device is preceded by another CAM device in the series, generating responses includes generating a local response in the CAM device and generating an output response based on the local response and a remote response provided by a preceding CAM device.

16. The method of claim 13, wherein:

generating responses to the operation request includes merging responses with a merging CAM device that receives at least two remote responses provided by different preceding CAM devices, and generates an output response based on at least two remote responses.

17. A content addressable memory (CAM) system, comprising:

a host processing component; and at least one CAM component having a vote circuit that selects one of a plurality of search status result values based on a comparison between a remote search result generated by another CAM component and a local search result generated by the at least one CAM component, each search status result value having a predetermined precedence with respect to one another.

18. The CAM of claim 17, wherein:

the at least one CAM component includes at least one input port and at least one output port.

19. The CAM of claim 17, wherein:

an output port of the host processing component is coupled to the at least one input port of a first CAM component;

the at least one CAM component includes a first CAM component, a second CAM component, and a third CAM component;

at least one output port of the first CAM component is coupled to at least one input port of a second CAM component, at least one output port of a third CAM component is coupled to an input port of the host processing component.

* * * * *